US012777881B2

(12) United States Patent
Carcasi et al.

(10) Patent No.: US 12,777,881 B2
(45) Date of Patent: Oct. 27, 2026

(54) SYSTEMS AND METHODS FOR DETERMINING A LOCALIZED FLUID VELOCITY OF A PROCESSING LIQUID DISPENSED ON A SPINNING SUBSTRATE BY TRACKING MOVEMENT OF AN INDUCED PERTURBATION IN THE PROCESSING LIQUID ACROSS THE SPINNING SUBSTRATE

(71) Applicant: Tokyo Electron Limited, Tokyo (JP)

(72) Inventors: Michael Carcasi, Austin, TX (US); Robert Brandt, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 642 days.

(21) Appl. No.: 18/210,772

(22) Filed: Jun. 16, 2023

(65) Prior Publication Data

US 2024/0420974 A1 Dec. 19, 2024

(51) Int. Cl.

| | |
|---|---|
| ***H10P 72/00*** | (2026.01) |
| ***G01P 5/10*** | (2006.01) |
| ***G01P 5/24*** | (2006.01) |
| ***H10P 74/00*** | (2026.01) |

(52) U.S. Cl.

CPC ............ *H10P 72/0604* (2026.01); *G01P 5/10* (2013.01); *G01P 5/245* (2013.01); *H10P 72/0404* (2026.01); *H10P 74/238* (2026.01)

(58) Field of Classification Search

CPC ........................................................ G01P 5/26

See application file for complete search history.

(56) References Cited

U.S. PATENT DOCUMENTS

| | | | | |
|---|---|---|---|---|
| 10,048,587 | B2 | 8/2018 | Carcasi et al. | |
| 2017/0332179 | A1* | 11/2017 | Bright .................. | H04R 23/002 |
| 2020/0338510 | A1 | 10/2020 | Nasman et al. | |

OTHER PUBLICATIONS

Korzhova et al., 2009, "Motion Analysis of Fluid Flow in a Spinning Disk Reactor", Scholar Commons, USF Graduate Theses and Disserations. (Year: 2009).*

Kim et al., "The Flow And Hydrodynamic Stability Of A Liquid Film On A Rotating Disc", IOP Publishing, Fluid Dynamics Research, 2009, 30 pgs.

Korzhova, "Motion Analysis Of Fluid Flow In A Spinning Disk Reactor", Scholar Commons, University of South Florida, 2009, 96 pgs.

Korzhova, "Tracking Fluid Flow In A Spinning Disk Reactor", Scholar Commons, University of South Florida, 2006, 43 pgs.

Sisoev et al., "Stationary Spiral Waves In Film Flow Over A Spinning Disk", Physics Of Fluid, 2010, 7 pgs.

* cited by examiner

*Primary Examiner* — Robert A Vetere

(74) *Attorney, Agent, or Firm* — Egan, Enders & Huston LLP.

(57) ABSTRACT

Systems and methods are provided to control operational parameter(s) of a spin-on process based on a localized fluid velocity of a processing liquid dispensed onto a surface of a spinning semiconductor substrate. In the present disclosure, a perturbation is introduced within a processing liquid dispensed onto the spinning semiconductor substrate. Movement of the perturbation is tracked over time, as the perturbation flows along with the processing liquid across the spinning substrate surface, to determine a localized fluid velocity of the processing liquid at one or more radial positions on the substrate surface. The localized fluid velocity is then used to control one or more operational parameters of a spin-on process.

20 Claims, 5 Drawing Sheets

SYSTEMS AND METHODS FOR DETERMINING A LOCALIZED FLUID VELOCITY OF A PROCESSING LIQUID DISPENSED ON A SPINNING SUBSTRATE BY TRACKING MOVEMENT OF AN INDUCED PERTURBATION IN THE PROCESSING LIQUID ACROSS THE SPINNING SUBSTRATE

RELATED ART

The present disclosure is related to co-pending U.S. patent application Ser. No. 18/210,762, entitled “Systems and Methods for Determining a Localized Fluid Velocity on a Spinning Substrate by Tracking Movement of a Tracer Across the Spinning Substrate” and co-pending U.S. patent application Ser. No. 18/210,773, entitled “Systems and Methods for Determining a Fluid Height and/or a Fluid Velocity of a Processing Liquid Dispensed on a Spinning Substrate”, each of which is filed on Jun. 16, 2023 and incorporated by reference herein.

BACKGROUND

The present disclosure relates to the processing of semiconductor substrates. In particular, the present disclosure relates to systems and methods for determining a localized fluid velocity of a processing fluid dispensed onto a spinning substrate.

Semiconductor fabrication processes may involve a wide variety of processing steps, including depositing, growing, patterning, etching, coating, developing and cleaning steps. Some of these processing steps may be spin-on processes, which are performed on a semiconductor substrate while the semiconductor substrate is disposed within a processing chamber having a spin chuck and at least one liquid dispense nozzle.

FIG. 1 illustrates one example of a processing chamber 100 having a spin chuck 110 and at least one liquid dispense nozzle 120. In a conventional spin-on process, a semiconductor substrate (or wafer W) to be processed is positioned on a spin chuck 110 and held in place, for example, by vacuum pressure or mechanical pin holders. During various processing steps, the spin chuck 110 and the semiconductor substrate W mounted thereon are rotated by a drive mechanism 115, which may be a stepper motor, etc. The drive mechanism 115 causes the spin chuck 110 to spin at a variety of rotational speeds during the application and flow of a liquid material onto a surface of the semiconductor substrate W.

In the processing chamber 100 shown in FIG. 1, a cup 130 is provided to capture processing liquids that are ejected or fall from the surface of the semiconductor substrate W. The spin chuck 110 and drive mechanism 115 are disposed within an opening in the cup 130. The spin chuck 110 supports and rotates (i.e., spins) the semiconductor substrate W about its central normal axis relative to the cup 130, which is stationary. As the spin chuck 110 rotates, the cup 130 captures and collects a majority of the processing liquid, which is ejected from the surface of the semiconductor substrate W by the centrifugal forces generated during rotation of the spin chuck 110. The liquid collected by the cup 130 is drained via a drain line 135 and drain unit (not shown). An exhaust line 137 and exhaust unit (not shown), such as a vacuum pump or other negative pressure-generating device, may also be provided within the processing chamber 100 to remove gaseous species (including but not limited to vapors released from substrate layers during processing) from the processing space inside the cup 130.

The at least one nozzle 120 is coupled to a liquid supply unit (not shown) through a liquid supply line 125 for dispensing a variety of processing liquids (L) onto the surface of the semiconductor substrate W. The processing liquid(s) supplied to the substrate surface may generally depend on the processing step(s) being performed. For example, the nozzle 120 may dispense a processing liquid onto the surface of the semiconductor substrate W to coat the substrate surface and form a layer of material (for example, a metal layer, a dielectric layer, a photoresist, etc.) on the substrate surface. In some cases, a patterning layer may be formed over the material layer and the material layer may be subsequently etched by dispensing an etchant chemical from the nozzle 120 onto the patterning layer. In another example, the nozzle 120 may dispense a develop solution onto the surface of the semiconductor substrate W to develop a layer previously deposited (for example, a photoresist layer) on the substrate surface. In yet other examples, the nozzle 120 may dispense a cleaning chemical and/or a rinse solvent onto the surface of the semiconductor substrate W to clean and/or rinse the substrate surface.

In spin-on processes, processing liquid(s) are dispensed onto the surface of the semiconductor substrate W while spin chuck 110 spins the substrate W at one or more specified rotational speeds. The processing liquid(s) may be dispensed in accordance with a predetermined process recipe. In some spin-on processes, for example, nozzle 120 may dispense a given processing liquid onto the substrate surface at a predetermined flow rate from one or more fixed locations while the substrate rotates at a predetermined rotation speed. In other spin-on processes, nozzle 120 may be scanned across the substrate surface at a specified scan rate while dispensing a given processing liquid onto the spinning substrate surface at a specified flow rate.

In some cases, the local fluid dynamics of a processing liquid dispensed onto a spinning substrate may adversely affect the local area performance of the substrate. For example, the local fluid dynamics introduced during a spin-on process may adversely affect critical dimensions on a patterned substrate, cause pattern collapse, etc. Thus, it would be beneficial to take local fluid dynamics into account when developing and/or optimizing a process recipe for a spin-on process.

SUMMARY

The present disclosure provides various embodiments of systems and methods that avoid adverse local fluid dynamic effects on a patterned substrate during a spin-on process. More specifically, the present disclosure provides embodiments of improved processing systems and methods that determine a localized fluid velocity of a processing liquid on a spinning semiconductor substrate and control operational parameter(s) of a spin-on process based on the localized fluid velocity.

The disclosed embodiments determine the localized fluid velocity by introducing a perturbation within the processing liquid dispensed onto the spinning semiconductor substrate. The perturbation creates a small, localized change in the processing liquid (for example, a localized thermal change, a surface wave, etc.), which moves along with the processing liquid across the spinning substrate surface at an unknown velocity. The progression of the perturbation across the spinning substrate surface is tracked over time and used to determine a localized fluid velocity of the processing liquid at one or more radial positions on the substrate surface. The localized fluid velocity determined at the one or more radial positions is then used to control one or more operational parameters (for example, the flow rate of the processing liquid dispensed onto the substrate, the rotational speed of the spin chuck, the scan rate or scan position of the nozzle, etc.) of a spin-on process. By controlling the operational parameters of the spin-process based on the localized fluid velocity, the embodiments disclosed herein avoid local fluid dynamic effects that tend to adversely affect the local area performance of patterned substrates during conventional spin-on processes.

According to one embodiment, a method is provided herein for controlling one or more operational parameters of a spin-on process used to dispense a processing liquid onto a surface of a semiconductor substrate. In some embodiments, the method may begin by dispensing the processing liquid onto the surface of the semiconductor substrate while the semiconductor substrate is rotated at a predetermined rotational speed. Although the processing liquid is dispensed at a predetermined flow rate, the processing liquid flows in a radial direction across the surface of the semiconductor substrate toward a periphery of the semiconductor substrate at an unknown fluid velocity. The method may further include inducing a perturbation within the processing liquid that flows along with the processing liquid at the unknown fluid velocity; tracking movement of the perturbation over time as the perturbation flows along with the processing liquid at the unknown fluid velocity; and utilizing the tracked movement of the perturbation to determine a localized fluid velocity of the processing liquid at one or more radial positions on the semiconductor substrate.

After the localized fluid velocity of the processing liquid is determined, the method may control one or more operational parameters of the spin-on process based on the localized fluid velocity of the processing liquid determined at the one or more radial positions. A wide variety of operational parameters may be controlled based on the localized fluid velocity of the processing liquid determined at the one or more radial positions. For example, the method may control: the predetermined rotational speed at which the semiconductor substrate is rotated, the predetermined flow rate at which the processing liquid is dispensed, a position of a nozzle dispensing the processing liquid and/or a scan rate of the nozzle.

The present disclosure contemplates inducing a wide variety of perturbations within the processing liquid. In some embodiments, the method may induce a perturbation within the processing liquid by creating a localized thermal change within the processing liquid, wherein the localized thermal change flows along with the processing liquid at the unknown fluid velocity. In some embodiments, the localized thermal change may be created within the processing liquid before the processing liquid is dispensed onto the surface of the semiconductor substrate. In other embodiments, the localized thermal change may be created within the processing liquid after the processing liquid is dispensed onto the surface of the semiconductor substrate.

When a localized thermal change is induced within the processing liquid, the method may track the movement of the perturbation over time by obtaining a plurality of images of the surface of the semiconductor substrate over time as the localized thermal change flows along with the processing liquid at the unknown fluid velocity. The method may then utilize the tracked movement of the perturbation to determine the localized fluid velocity of the processing liquid at the one or more radial positions by: (a) analyzing the plurality of images to determine a first radial position of the localized thermal change at a first time and a second radial position of the localized thermal change at a second time, which is greater than the first time; and (b) determining the localized fluid velocity of the processing liquid between the first radial position and the second radial position by dividing a difference between the second radial position and the first radial position by a difference between the second time and the first time.

In other embodiments, the method may induce a perturbation within the processing liquid by creating a first surface wave within the processing liquid, wherein the first surface wave flows along with the processing liquid at the unknown fluid velocity. For example, the method may create the first surface wave within the processing liquid by utilizing sound energy to create the first surface wave within the processing liquid as the processing liquid is dispensed onto the surface of the semiconductor substrate while the semiconductor substrate is rotated at the predetermined rotational speed.

When a first surface wave is induced within the processing liquid, the method may track the movement of the perturbation over time by obtaining a plurality of images of the surface of the semiconductor substrate over time as the first surface wave flows along with the processing liquid at the unknown fluid velocity. The method may then utilize the tracked movement of the perturbation to determine the localized fluid velocity of the processing liquid at the one or more radial positions by: (a) analyzing the plurality of images to determine radial positions of the first surface wave as the first surface wave flows along with the processing liquid at the unknown fluid velocity; (b) comparing the radial positions of the first surface wave to baseline radial positions of a second surface wave, which was previously created within the processing liquid when the semiconductor substrate was stationary, to detect changes in the radial positions of the first and second surface waves at various radial positions; and (c) determining the localized fluid velocity of the processing liquid at the one or more radial positions based on the detected changes in the radial positions of the first and second surface waves at the various radial positions.

According to yet another embodiment, a system is provided herein for controlling one or more operational parameters of a spin-on process used to dispense a processing liquid onto a surface of a semiconductor substrate. The system may generally include a spin chuck, a liquid dispense system, an optical sensor and at least one programmable integrated circuit (IC) coupled to the optical sensor, the liquid dispense system and the spin chuck.

The spin chuck, which has a support surface for supporting a semiconductor substrate, is configured to rotate the semiconductor substrate at a predetermined rotational speed. The liquid dispense system has at least one nozzle coupled to dispense a processing liquid onto a surface of the semiconductor substrate while the semiconductor substrate is rotated by the spin chuck. Although the at least one nozzle dispenses the processing liquid at a predetermined flow rate, the processing liquid flows in a radial direction across the surface of the semiconductor substrate toward a periphery of the semiconductor substrate at an unknown fluid velocity. The optical sensor is coupled to track movement of a perturbation induced within the processing liquid over time as the perturbation flows along with the processing liquid at the unknown fluid velocity. The at least one programmable IC is configured to execute program instructions stored within a non-transitory memory to: (a) receive an output signal from the optical sensor, the output signal used to track the movement of the perturbation over time; (b) determine a localized fluid velocity of the processing liquid at one or more radial positions on the semiconductor substrate using the output signal received from the optical sensor; and (c) control one or more operational parameters of a spin-on process based on the localized fluid velocity of the processing liquid determined at the one or more radial positions.

In some embodiments, the at least one programmable IC may be configured to execute the program instructions stored within the non-transitory memory to control one or more of the following based on the localized fluid velocity of the processing liquid: the predetermined rotational speed of the spin chuck; the predetermined flow rate at which the processing liquid is dispensed by the at least one nozzle; a position of the at least one nozzle; and a scan rate of the at least one nozzle.

In some embodiments, the perturbation induced within the processing liquid may be a localized thermal change, which is induced within the processing liquid before or after the processing liquid is dispensed onto the surface of the semiconductor substrate. For example, the localized thermal change may be induced within the processing liquid by one or more of the following: (a) a heating element provided around a liquid dispense line coupled to the at least one nozzle, wherein the heating element is configured to induce the localized thermal change within the processing liquid before the processing liquid is dispensed onto the surface of the semiconductor substrate; (b) a mixing component provided within or coupled to the at least one nozzle for duty cycle mixing two different temperature lines of the processing liquid before the processing liquid is dispensed onto the surface of the semiconductor substrate; (c) a heated wire introduced into the processing liquid dispensed by the at least one nozzle; and (d) a laser directed toward the surface of the semiconductor substrate, wherein the laser is configured to induce the localized thermal change within the processing liquid after the processing liquid is dispensed onto the surface of the semiconductor substrate by creating one or more hot spots on the surface of the semiconductor substrate.

When a localized thermal change is induced within the processing liquid, the optical sensor may be an infrared (IR) camera, which is coupled to capture a plurality of images of the surface of the semiconductor substrate as the localized thermal change flows along with the processing liquid at the unknown fluid velocity. In such embodiments, the at least one programmable IC may be coupled to receive the plurality of images from the IR camera, and may be configured to execute the program instructions stored within the non-transitory memory to: (a) analyze the plurality of images to determine a first radial position of the localized thermal change at a first time and a second radial position of the localized thermal change at a second time, which is greater than the first time; and (b) determine the localized fluid velocity of the processing liquid between the first radial position and the second radial position by dividing a difference between the second radial position and the first radial position by a difference between the second time and the first time.

In other embodiments, the perturbation induced within the processing liquid may be a first surface wave, which is induced within the processing liquid as the processing liquid is dispensed onto the surface of the semiconductor substrate while the semiconductor substrate is rotated at the predetermined rotational speed. For example, one or more sound transducers may be coupled to apply sound energy to the spin chuck, the at least one nozzle or the processing liquid to induce the first surface wave within the processing liquid.

When a first surface wave is induced within the processing liquid, the optical sensor may be a visible light spectrum camera, which is coupled to capture a plurality of images of the surface of the semiconductor substrate as the first surface wave flows along with the processing liquid at the unknown fluid velocity. In such embodiments, the at least one programmable IC may be coupled to receive the plurality of images from the visible light spectrum camera, and may be configured to execute the program instructions stored within the non-transitory memory to: (a) analyze the plurality of images to determine radial positions of the first surface wave as the first surface wave flows along with the processing liquid at the unknown fluid velocity; (b) compare the radial positions of the first surface wave to baseline radial positions of a second surface wave, which was previously created within the processing liquid when the semiconductor substrate was stationary, to detect changes in the radial positions of the first and second surface waves at various radial positions; and (c) determine the localized fluid velocity of the processing liquid at the one or more radial positions based on the detected changes in the radial positions of the first and second surface waves at the various radial positions.

Various embodiments of systems and methods are provided herein for processing a semiconductor substrate, and more specifically, for controlling operational parameter(s) of a spin-on process used to process a spinning semiconductor substrate based on a localized fluid velocity of a processing liquid dispensed onto a surface of the spinning semiconductor substrate. Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed inventions. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Spin-on processes are commonly used to dispense processing liquid(s) onto a surface of a semiconductor substrate while the substrate is rotating or spinning at a given rotational speed. In spin-on processes, processing liquid(s) are dispensed from one or more nozzles onto the spinning substrate surface. The nozzle(s) may be fixed or movable and can be positioned above and/or below the substrate surface, depending on the surface(s) desired to be coated with the processing liquid.

As noted above, the local fluid dynamics of a processing liquid dispensed onto a spinning substrate may adversely affect the local area performance of the substrate. For example, the local fluid dynamics introduced during a conventional spin-on process may adversely affect critical dimensions on a patterned substrate, cause pattern collapse, etc. These local fluid dynamic effects may arise, for example, from the pattern orientation relative to the radial liquid front, the pattern height and/or the process recipe used to perform the spin-on process (for example, the flow rate of the processing liquid dispensed onto the substrate, the rotational speed of the spin chuck, the scan rate or scan position of the nozzle, etc.).

The present disclosure provides various embodiments of systems and methods to avoid the adverse local fluid dynamic effects that occur on patterned substrates during conventional spin-on processes. In particular, the present disclosure provides embodiments of improved processing systems and methods that determine a localized fluid velocity of a processing liquid on a spinning semiconductor substrate and control operational parameter(s) of a spin-on process based on the localized fluid velocity.

The disclosed embodiments determine the localized fluid velocity by introducing a perturbation within the processing liquid dispensed onto the spinning semiconductor substrate. The perturbation creates a small, localized change in the processing liquid (for example, a localized thermal change, a surface wave, etc.), which moves along with the processing liquid across the spinning substrate surface at an unknown velocity. The progression of the perturbation across the spinning substrate surface is tracked over time and used to determine a localized fluid velocity of the processing liquid at one or more radial positions on the substrate surface. The localized fluid velocity determined at the one or more radial positions is then used to control one or more operational parameters (for example, the flow rate of the processing liquid dispensed onto the substrate, the rotational speed of the spin chuck, the scan rate or scan position of the nozzle, etc.) of a spin-on process. By controlling the operational parameters of the spin-process based on the localized fluid velocity, the embodiments disclosed herein avoid local fluid dynamic effects that tend to adversely affect the local area performance of patterned substrates during conventional spin-on processes.

Figure 2:
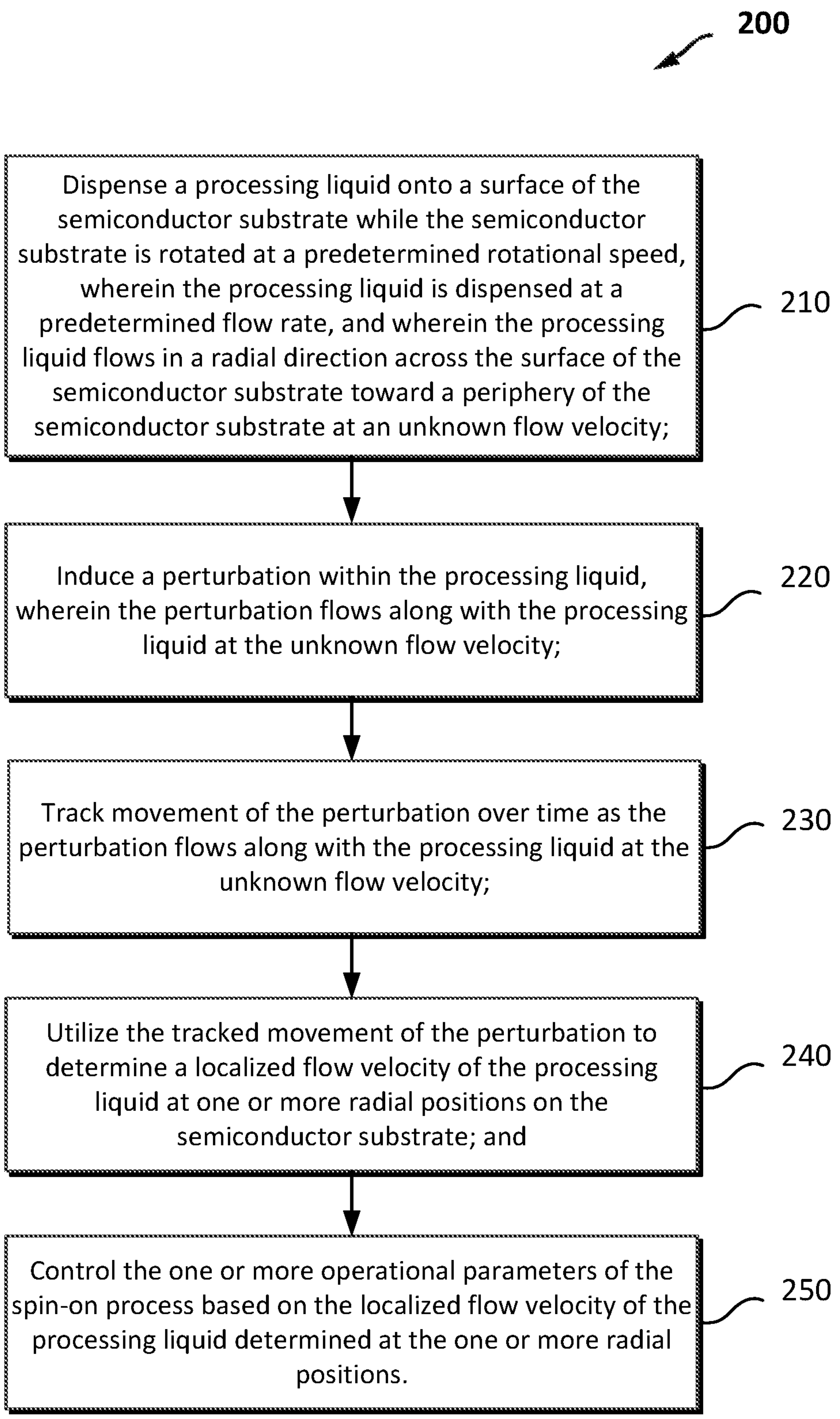
FIG. 2 is a flowchart diagram illustrating one embodiment of a method that determines a localized fluid velocity of a processing liquid on a spinning semiconductor substrate and controls operational parameters of a spin-on process based on the localized fluid velocity.

Turning now to the Drawings, FIG. 2 illustrates one embodiment of a method 200 in accordance with the present disclosure. More specifically, FIG. 2 illustrates one embodiment of a method 200, which can be used to determine a localized fluid velocity of a processing liquid dispensed onto a surface of a spinning semiconductor substrate and control operational parameters of a spin-on process based on the determined localized fluid velocity.

The method 200 shown in FIG. 2 may determine the localized fluid velocity offline during a testing phase, or dynamically while performing a spin-on process to process a semiconductor substrate. In some embodiments, the localized fluid velocity is determined during an initial testing phase to determine an optimum process recipe for processing a semiconductor substrate during a subsequently performed spin-on process. In other embodiments, the localized fluid velocity is determined dynamically during a spin-on process and used to adjust the process recipe in real-time as the semiconductor substrate is being processed.

In some embodiments, the method 200 may begin (in step 210) by dispensing a processing liquid onto a surface of a semiconductor substrate while the semiconductor substrate is rotated at a predetermined rotational speed (for example, a rotational speed within a range of 200 to 3000 rotations per minute, RPM). Although the processing liquid is dispensed onto the substrate surface at a predetermined flow rate, the rate (or "fluid velocity") with which the processing liquid flows radially across the surface of the spinning substrate is dependent on characteristics of the processing liquid (for example, the viscosity of the processing liquid), characteristics of the substrate (for example, a patterned vs. unpatterned substrate, the pattern orientation and pattern height of a patterned substrate, etc.) and characteristics of the spin-on process (for example, the flow rate of the processing liquid dispensed onto the substrate, the rotational speed of the spin chuck, the scan rate and/or scan position of the nozzle, etc.). As a consequence, the processing liquid dispensed onto the substrate surface (in step 210) flows in a radial direction across the surface of the semiconductor substrate toward a periphery of the semiconductor substrate at an unknown fluid velocity.

The method 200 further includes inducing a perturbation within the processing liquid (in step 220). A wide variety of perturbations may be induced within the processing liquid in step 220. In some embodiments, a perturbation is induced in step 220 by creating at least one localized thermal change (TC) within the processing liquid. The localized thermal change (TC) can be created within the processing liquid (L) by heating the processing liquid before or after dispensing the processing liquid onto the substrate surface. In other embodiments, a perturbation is induced in step 220 by creating a first surface wave (SW) within the processing liquid as the processing liquid is dispensed onto the surface of the spinning substrate. The first surface wave may be created within the processing liquid (L) by applying sound energy at a single frequency or at multiple frequencies.

As the processing liquid is dispensed onto the surface of the spinning substrate, the perturbation (for example, the localized temperature change or surface wave) flows along with the processing liquid across the substrate surface at the unknown fluid velocity. The method 200 further includes tracking movement of the perturbation over time as the perturbation flows along with the processing liquid at the unknown fluid velocity (in step 230). In some embodiments, the movement of the perturbation may be tracked (in step 230) by obtaining a plurality of images of the surface of the semiconductor substrate over time as the perturbation flows along with the processing liquid at the unknown fluid velocity.

The method 200 further includes utilizing the tracked movement of the perturbation to determine a localized fluid velocity of the processing liquid at one or more radial positions on the semiconductor substrate (in step 240). A wide variety of methods may be used to determine a localized fluid velocity of the processing liquid in step 240, depending on the perturbation induced in step 220.

When a localized thermal change (TC) is induced in step 220, the progression of the localized thermal change may be tracked in step 230 by obtaining a plurality of images of the substrate surface over time as the localized thermal change flows along with the processing liquid at the unknown fluid velocity. In such embodiments, the method 200 may analyze the plurality of images to determine a first radial position of the localized thermal change at a first time and a second radial position of the localized thermal change at a second time, which is greater than the first time. The method 200 may then determine the localized fluid velocity of the processing liquid between the first radial position and the second radial position (in step 240) by dividing a difference between the second radial position and the first radial position by a difference between the second time and the first time.

A different method may be utilized to determine the localized fluid velocity in step 240 when a first surface wave is induced within the processing liquid. When a first surface wave (SW) is induced in step 220, the progression of the first surface wave (SW) may be tracked in step 230 by obtaining a plurality of images of the substrate surface over time as the first surface wave flows along with the processing liquid at the unknown fluid velocity. The method 200 may then analyze the plurality of images to determine radial positions of the first surface wave as the first surface wave flows along with the processing liquid at the unknown fluid velocity. In some embodiments, the method 200 may compare the radial positions of the first surface wave to baseline radial positions of a second surface wave, which was previously created within the processing liquid when the semiconductor substrate was stationary, to detect changes in the radial positions of the first and second surface waves at various radial positions. In other embodiments, the method 200 may compare radial positions of the first surface wave, which are obtained from the plurality of images over time as the first surface wave flows along with the processing liquid at the unknown fluid velocity, to detect changes in the radial positions of the first surface wave between various times. The method 200 may then determine the localized fluid velocity of the processing liquid at one or more radial positions (in step 240) based on: (a) the detected changes in the radial positions of the first and second surface waves at the various radial positions, or (b) the detected changes in the radial positions of the first surface wave between various times.

The method 200 shown in FIG. 2 further includes controlling one or more operational parameters of a spin-on process in step 250 based on the localized fluid velocity determined in step 240. For example, the method 200 may control the predetermined rotational speed at which the semiconductor substrate is rotated, the predetermined flow rate at which the processing liquid is dispensed, the position of a nozzle dispensing the processing liquid and/or the scan rate of the nozzle in step 250. By controlling one or more operational parameters of the spin-on process based on the localized fluid velocity determined in step 240, method 200 avoids creating local fluid dynamics that could adversely affect local area performance of the substrate during spin processing.

Figure 3:
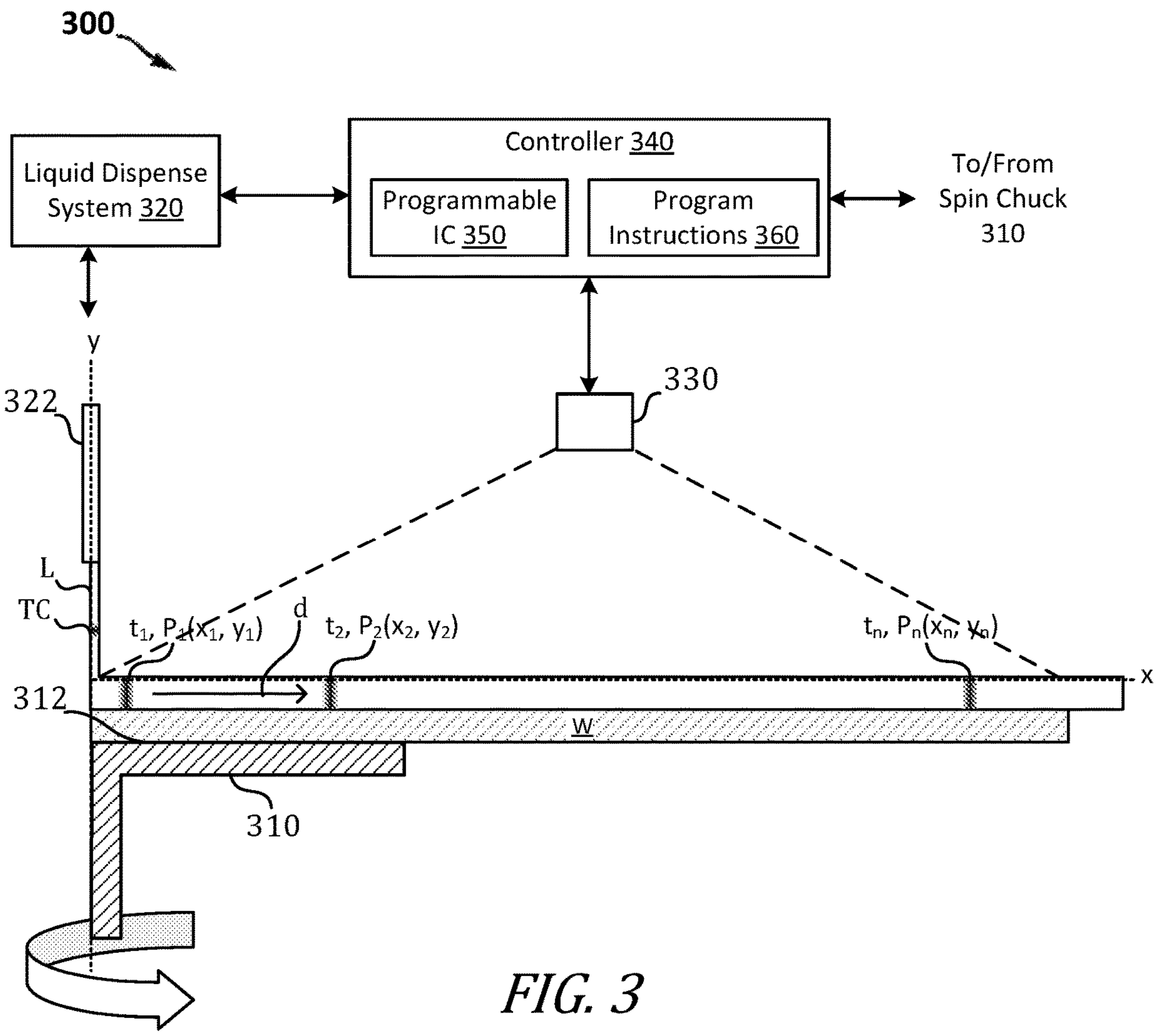
FIG. 3 is a block diagram illustrating a first embodiment of a processing system that utilizes the method shown in FIG. 2.

The method 200 shown in FIG. 2 may be performed within a wide variety of processing systems that perform spin processing. Various embodiments of example processing systems are shown in FIGS. 3-4 and described in more detail below. In each of the illustrated embodiments, the processing system includes a spin chuck 310, a liquid dispense system 320, an optical sensor 330 and a controller 340 having at least one programmable integrated circuit (IC) 350 for executing program instructions 360 stored within non-transitory memory. Although not shown in FIGS. 3-4, the processing system may also include other hardware and software components, as is known in the art.

Figure 1:
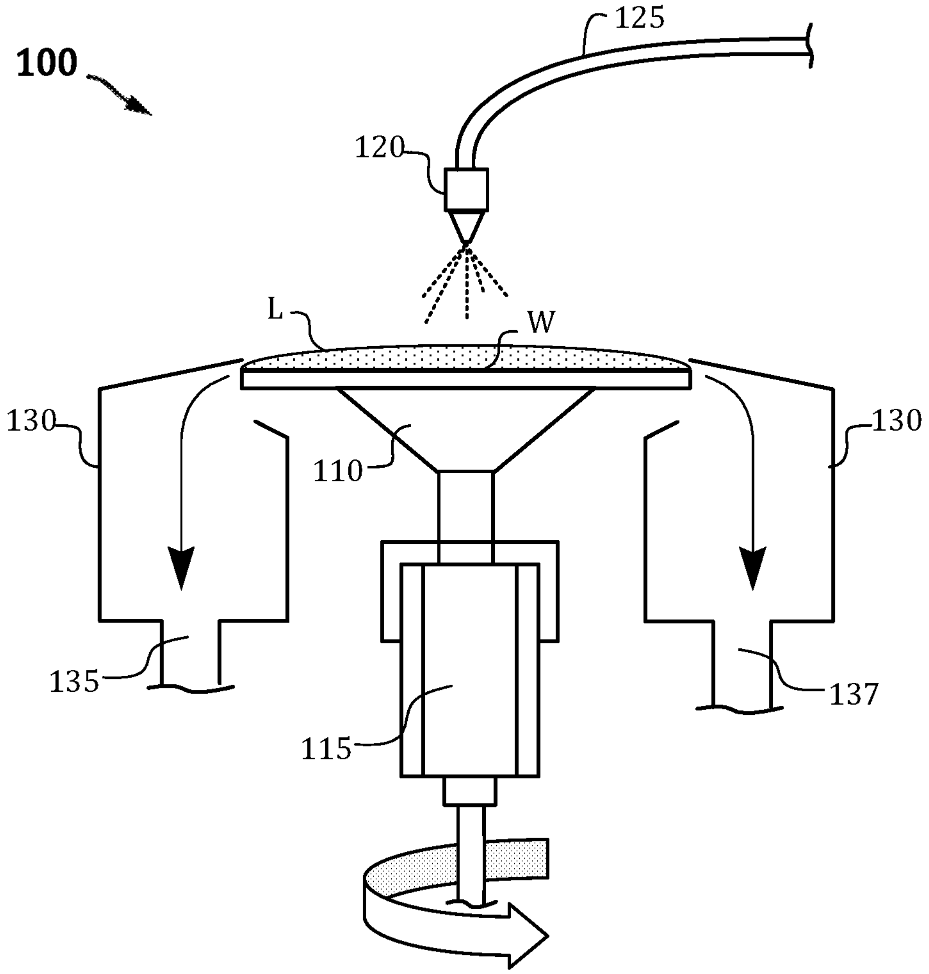
FIG. 1 (Prior Art)
FIG. 1 (PRIOR ART) illustrates an interior of an example processing chamber having at least one nozzle for dispensing a processing liquid onto a surface of a spinning semiconductor substrate (W) during a spin-on process.

The spin chuck 310 has a support surface 312 for supporting a semiconductor substrate (W) and a drive mechanism (as shown, for example, in FIG. 1) for rotating the spin chuck 310 and the semiconductor substrate W mounted thereon at a predetermined rotational speed. The liquid dispense system 320 includes at least one nozzle 322 for dispensing a processing liquid (L) onto a surface of the semiconductor substrate W while the semiconductor substrate is rotated by the spin chuck 310. A wide variety of processing liquids may be dispended onto the substrate surface, depending on the spin-on process being characterized or performed. For example, the processing liquid (L) may be a coating liquid, an etchant chemical, a develop solution, a cleaning chemical or a rinse solvent. Once dispensed, the processing liquid (L) flows in a radial direction (d) across the surface of the semiconductor substrate W toward a periphery of the substrate at an unknown fluid velocity. A perturbation (for example, a localized thermal change or surface wave) is induced within the processing liquid (L). The optical sensor 330 tracks movement of the perturbation over time as the perturbation flows along with the processing liquid (L) at the unknown fluid velocity, and generates an output signal that is supplied to the controller 340. The controller 340 analyzes the output signal received from the optical sensor 330 to determine a localized fluid velocity of the processing liquid (L) at one or more radial positions (P) on the semiconductor substrate W, and uses the localized fluid velocity to control one or more operational parameters of a currently or subsequently performed spin-on process.

FIG. 3 illustrates one embodiment of a processing system 300 that utilizes the method 200 shown in FIG. 2. In the embodiment shown in FIG. 3, the controller 340 determines the localized fluid velocity of the processing liquid (L) by tracking movement of a small, localized temperature change (TC), which is induced within the processing liquid while the semiconductor substrate is rotated by the spin chuck 310. The localized thermal change (TC) can be created using a wide variety of methods. Although examples are provided below for explanatory purposes, one skilled in the art would understand how other methods could be used to create a small, localized temperature change within the processing liquid.

In one example, a localized thermal change (TC) can be created within the processing liquid (L) by heating the processing liquid prior to dispense, for example, by providing a heating element around an outer circumference of the liquid dispense line, or a mixing component provided within or coupled to the nozzle for duty cycle mixing two different temperature lines of process liquids, etc. Although not strictly limited to such, examples of suitable mixing components are disclosed in U.S. Pat. Nos. 11,383,211 and 10,048,587, the entirety of which are herein incorporated by reference. In another example, a localized thermal change (TC) can be created within the processing liquid (L) by heating the processing liquid after dispense (for example, by introducing a heated wire into the process liquid dispensed by nozzle 322). In yet another example, a localized thermal change (TC) can be created within the processing liquid (L) by heating small regions of the substrate using conduction or absorption methods. For example, a laser (such as a near infrared (NIR) laser diode) directed towards the substrate surface can be used to heat small, localized regions of the substrate and create hot spots on the substrate surface, which induce a localized thermal change within the processing liquid. In some embodiments, the laser may be used to create a grid or radial line of hot spots across the substrate surface that can be tracked. This latter method may allow a lower temperature difference to be created, with a smaller spot size, since the hot spots could be tracked over shorter distances.

The progression of the localized thermal change (TC) is tracked continuously across the surface of the spinning substrate by the optical sensor 330. The optical sensor 330 may be implemented in a wide variety of ways. In some embodiments, the optical sensor 330 is an infrared (IR) camera or video camera, which is positioned above the substrate surface for capturing images of the substrate surface as the localized thermal change (TC) flows along with the processing liquid (L) at the unknown fluid velocity. The IR camera includes an image sensor, which is configured to capture images of the substrate surface at a specified frame rate. In some embodiments, a long wave infrared (LWIR) image sensor, which is sensitive to a range of infrared light between about 8 μm and 14 μm, may be used to detect distinct temperature differences within the processing liquid. The images captured by the IR camera are provided to the controller 340 for image processing and analysis. The controller 340 analyzes the images captured over time to track the progression of the localized thermal change (TC) and determine the local fluid velocity of the processing liquid (L) at various radial positions (P) on the substrate surface.

The controller 340 shown in FIG. 3 may determine the localized fluid velocity in a wide variety of ways. In one embodiment, the controller 340 determines the rate at which the localized thermal change (TC) progresses over time from one radial position to another. As shown in FIG. 3, for example, the localized thermal change (TC) induced within the processing liquid (L) progresses from a first radial position $P_1(x_1, y_1)$ at time ($t_1$) to second radial position $P_2(x_2, y_2)$ at time ($t_2$) to eventually an $n^{th}$ radial position radial position $P_n(x_n, y_n)$ at time ($t_n$) near the periphery of the substrate. The optical sensor 330 obtains images of the substrate surface that depict the progression of the localized thermal change (TC) across the spinning substrate. The controller 340 receives the image frames captured by the optical sensor 330 over time and utilizes image processing and analysis software (contained, for example, within program instructions 360) to: (a) determine the radial position (P) of the localized thermal change (TC) as it progresses across the surface of the spinning substrate (for example, from $P_1$ to $P_2$, $P_3$, $P_4$ . . . $P_n$), and (b) determine the localized fluid velocity of the processing liquid (L) at one or more of the radial positions.

For example, the controller 340 may determine the localized fluid velocity (v) of the processing liquid (L) between the first radial position ($P_1$) and the second radial position ($P_2$) by dividing a difference between the second radial position ($P_2$) and the first radial position ($P_1$) by a difference between the second time ($t_2$) and the first time ($t_1$) as shown in the equation 1 below.

$$v(\Delta P) = \frac{P_2 - P_1}{t_2 - t_1} \qquad \text{EQ. 1}$$

The localized fluid velocity (v) at other radial positions (P) can be determined in a similar manner. In some embodiments, the controller 340 may utilize the localized fluid velocity (v) determined at one or more of the radial positions (P) to control one or more operating parameters of a spin-on process.

Figure 4A:
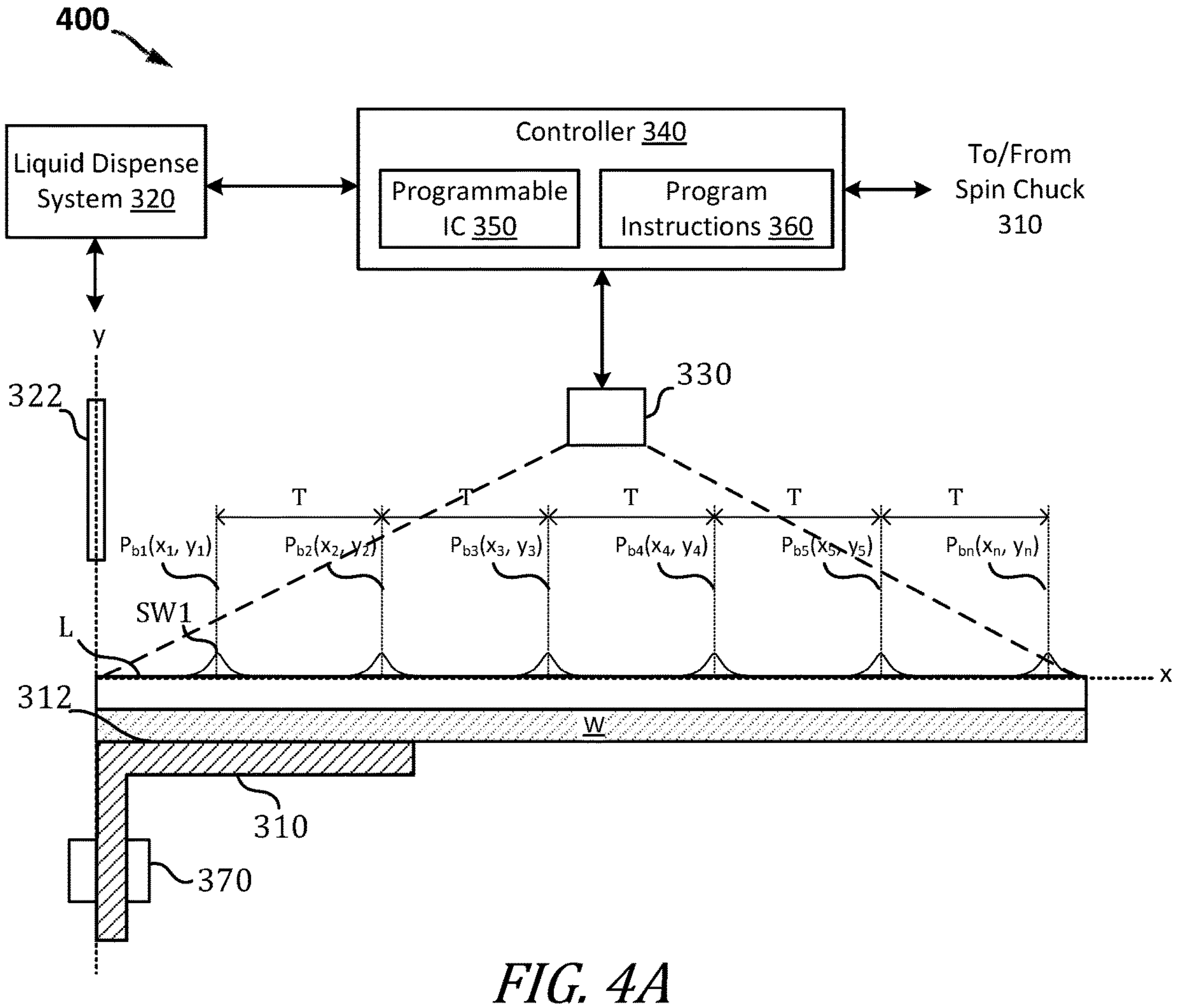
FIGS. 4A-4B are block diagrams illustrating a second embodiment of a processing system that utilizes the method shown in FIG. 2.
Figure 4B:
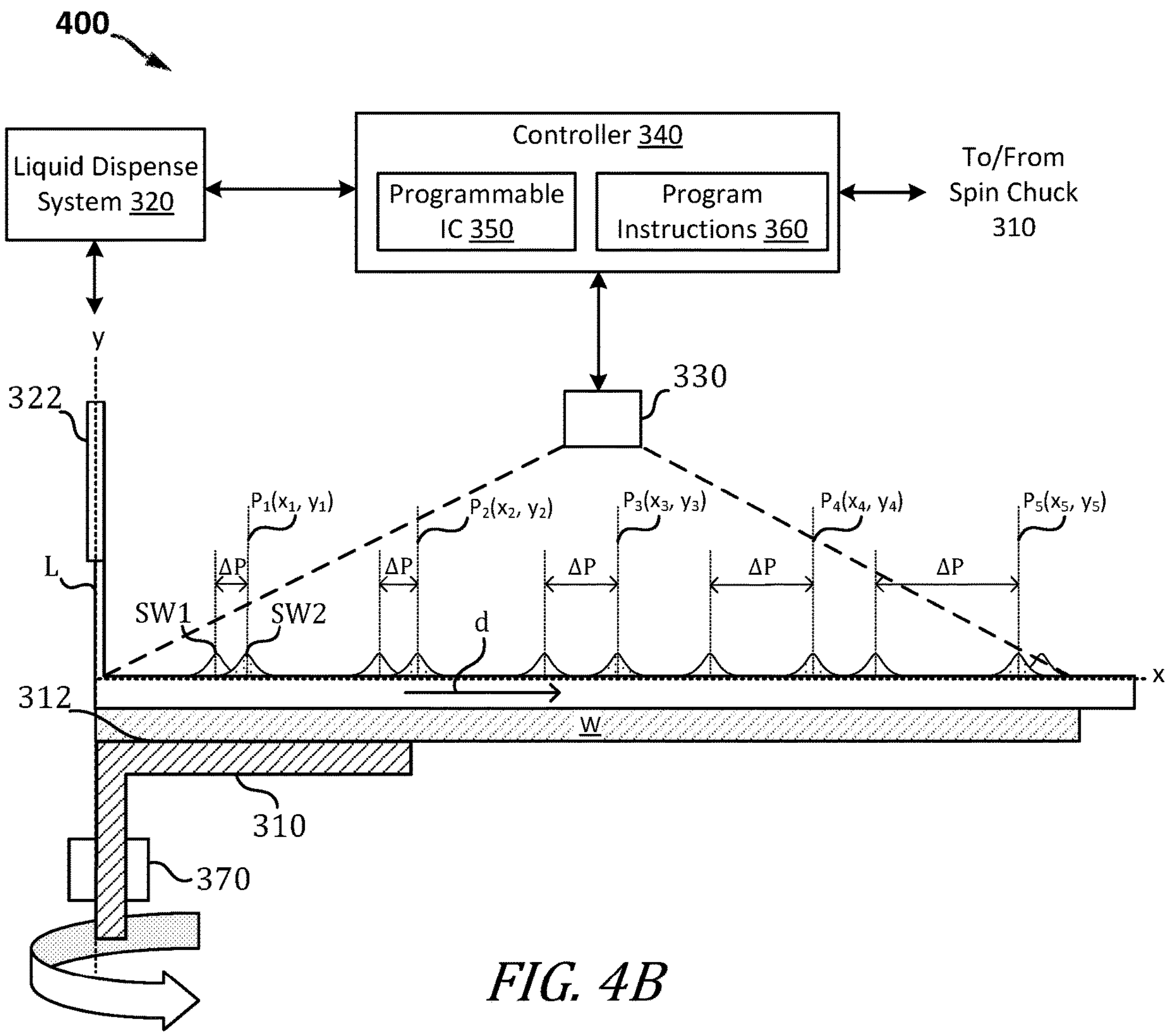

FIGS. 4A-4B illustrate another embodiment of processing system 400 that utilizes the method 200 shown in FIG. 2. Like the previous embodiment, the processing system 400 includes a spin chuck 310, a liquid dispense system 320, an optical sensor 330 and a controller 340 having at least one programmable integrated circuit (IC) 350 for executing program instructions 360 stored within non-transitory memory. Unlike the previous embodiment, the controller 340 shown in FIGS. 4A-4B determines the localized fluid velocity of the processing liquid (L) by tracking movement of at least one surface wave (SW), which is created within the processing liquid while the semiconductor substrate is rotated by the spin chuck 310.

The surface wave can be created using a wide variety of methods. Although examples are provided below for explanatory purposes, one skilled in the art would understand how other methods could be used to create at least one surface wave within the processing liquid dispensed onto the substrate surface.

In some embodiments, surface waves may be created within the processing liquid by coupling a sound transducer, or a series of sound transducers, to various components of the processing system 400. For example, one or more sound transducer(s) 370 can be integrated into the spin chuck assembly, as shown schematically in FIGS. 4A-4B. In other examples (not shown), sound transducer(s) can be incorporated within the at least one nozzle 322 or within (or near) the surface of the processing liquid (L). For example, a transducing radial bar can be inserted into the processing liquid (L) to create surface waves within the processing liquid dispensed onto the substrate surface. The surface waves created within the processing liquid may be generated from one sound transducer at a fixed frequency, one sound transducer at a programmed series of frequencies or multiple sound transducers at multiple frequencies. The frequencies used to create the surface waves can range from a few Hz to ultrasonic (kHz) frequencies.

The progression of the surface waves (SW) is tracked continuously across the surface of the spinning substrate by the optical sensor 330. The optical sensor 330 may be implemented in a wide variety of ways. In some embodiments, the optical sensor 330 may be visible light spectrum camera or video camera, which is positioned above the substrate surface for capturing images of the substrate surface as the surface waves (SW) flow along with the processing liquid (L) at the unknown fluid velocity. In some embodiments, the camera includes a complementary metal oxide semiconductor (CMOS) image sensor, which is configured to capture images of the substrate surface at a specified frame rate. In one example embodiment, the optical sensor 330 is a CMOS video camera with polarization state filters built into the pixels (such as Sony's Polarsens™ camera), as this allows for easier determination of the liquid perturbation. The images captured by the camera are provided to the controller 340 for image processing and analysis. The controller 340 analyzes the images captured over time to track the progression of the surface waves (SW) and determine the local fluid velocity of the processing liquid (L) at various radial positions (P) on the substrate surface.

The controller 340 shown in FIGS. 4A-4B may determine the localized fluid velocity in a wide variety of ways. In one embodiment, the controller 340 determines the rate at which surface waves (SW) created within a processing liquid (L) progress across the substrate surface by: (a) determining a baseline location of the surface waves under static fluid conditions, (b) determining a location of the surface waves under dynamic process conditions, and (c) comparing the location of the surface waves obtained under dynamic process conditions to the baseline location of the surfaces waves to detect a change in the location of the surface waves. The change in the location of the first and second surface waves can then be used to determine the local fluid velocity of the processing liquid within various regions of the substrate.

FIG. 4A illustrates an example method for determining a baseline location of surface waves generated under static fluid conditions. In the method shown in FIG. 4A, sound transducer(s) 370 apply sound energy at a fixed frequency (f=1/T) to induce a first surface wave (SW1) within a processing liquid (L), which is provided on the substrate surface while the semiconductor substrate W is stationary. For example, the first surface wave (SW1) may be induced within the processing liquid (L) during a puddle process. As shown in FIG. 4A, the first surface wave (SW1) progresses from a first baseline radial position $P_{b1}(x_1, y_1)$ at time $(t_{b1})$ to a second baseline radial position $P_{b2}(x_2, y_2)$ at time $(t_{b2})$ to eventually an $n^{th}$ baseline radial position $P_{bn}(x_n, y_n)$ at time $(t_{bn})$ near the periphery of the substrate. The optical sensor 330 obtains images of the substrate surface that depict the progression of the first surface wave (SW1) across the stationary substrate surface. The controller 340 receives the image frames captured by the optical sensor 330 over time and utilizes image processing and analysis software (contained, for example, within program instructions 360) to determine baseline radial positions (Pb) of the first surface wave (SW1) as it progresses across the stationary substrate surface over time (for example, from $P_{b1}$ to $P_{b2}$, $P_{b3}$, $P_{b4}$ . . . $P_{bn}$).

FIG. 4B illustrates an example method for determining a location of surface waves generated under dynamic process conditions. In the method shown in FIG. 4B, sound transducer(s) 370 apply sound energy at the same fixed frequency (f=1/T) to create a second surface wave (SW2) within a processing liquid (L), which is dispensed onto the surface of the semiconductor substrate W while the substrate is rotated at a predetermined rotational speed. Like the first surface wave (SW1), the second surface wave (SW2) progresses from a first radial position $P_1(x_1, y_1)$ at time $(t_1)$ to second radial position $P_2(x_2, y_2)$ at time $(t_2)$ to eventually an $n^{th}$ radial position radial position $P_n(x_n, y_n)$ at time $(t_n)$ near the periphery of the substrate. However, the second surface wave (SW2) progresses across the substrate surface at a faster rate, due to the dynamic process conditions (for example, the flow rate with which the processing liquid is dispensed, the rotational speed of the spin chuck, etc.). The optical sensor 330 obtains images of the substrate surface that depict the progression of the second surface wave (SW2) as the surface wave progresses across the spinning substrate surface. The controller 340 receives the image frames captured by the optical sensor 330 over time and utilizes image processing and analysis software (contained, for example, within program instructions 360) to determine the radial positions (P) of the second surface wave (SW2) as it progresses across the spinning substrate surface over time (for example, from $P_1$ to $P_2$, $P_3$, $P_4$ . . . $P_n$).

In the embodiment shown in FIGS. 4A-4B, the controller 340 compares the radial positions ($P_1$, $P_2$, $P_3$, $P_4$ . . . $P_n$) of the second surface wave (SW2) to the baseline radial positions ($P_{b1}$, $P_{b2}$, $P_{b3}$, $P_{b4}$ . . . $P_{bn}$) of the first surface wave (SW1) to detect a change in the radial position ($\Delta P_i = P_i - P_{ib}$) of the surface waves (SW1 and SW2) generated under static and dynamic process conditions. As shown in FIG. 4B, the change in the radial position (ΔP) between the surface waves SW1 and SW2 increases in the radial direction (d), due to centrifugal forces on the spinning substrate. The controller 340 uses the detected change in the radial position (ΔP) between the surface waves SW1 and SW2 to determine the localized fluid velocity (v) of the processing liquid (L) across the spinning substrate at various radial positions. For example, the controller 340 may determine the localized fluid velocity (v) of the processing liquid (L) at a given radial position ($P_i$) by determining the rate at which the radial position of the surface waves SW1 and SW2 change over time, as shown in the equation 2 below.

$$v(\Delta P_i) = \frac{P_i - P_{ib}}{t_i - t_{ib}} \qquad \text{EQ. 2}$$

The embodiment shown in FIGS. 4A-4B determines the localized fluid velocity (v) of the processing liquid (L) by detecting a change in the radial position ($\Delta P_i = P_i - P_{ib}$) of two different surface waves (SW1 and SW2) generated under static and dynamic process conditions. However, the techniques described herein are not strictly limited to such an embodiment.

In other embodiments (not shown), the localized fluid velocity (v) of the processing liquid (L) may be determined by detecting a change in the radial position ($\Delta P_i = P_i - P_{i-1}$) over time (Δt) of a single surface wave generated under dynamic process conditions (such as, for example, the second surface wave SW2 shown in FIG. 4B). In this alternative embodiment, a surface wave is created within the processing liquid (L) while the semiconductor substrate W is rotated at a predetermined rotational speed. The optical sensor 330 captures images of the substrate surface (at a specified frame rate) that depict the progression of the surface wave across the spinning substrate surface. The controller 340 receives the image frames captured by the optical sensor 330 over time and utilizes image processing and analysis software (contained, for example, within program instructions 360) to determine radial positions (P) of the surface wave (for example, SW2) as it progresses across the spinning substrate surface over time (for example, from $P_1$ to $P_2$, $P_3$, $P_4$ . . . $P_n$). For example, the controller 340 may analyze at least two of the images obtained by the optical sensor 330 to detect a change in the radial position (ΔP) of the surface wave over time. Since the images are captured at a specified frame rate, or known time period (Δt), the controller 340 may determine the localized fluid velocity (v) of the processing liquid (L) across the spinning substrate by dividing the detected change in the radial position (ΔP) of the surface wave by the known time period (Δt) between the at least two images.

The controller 340 shown in FIGS. 3-4 may determine the localized fluid velocity (v) offline during a testing phase, or dynamically while performing a spin-on process to process a semiconductor substrate. In some embodiments, for example, the controller 340 determines the localized fluid velocity (v) during an initial testing phase to determine an optimum process recipe for processing a semiconductor substrate during a subsequently performed spin-on process. In other embodiments, the controller 340 determines the localized fluid velocity (v) dynamically during a spin-on process and uses the dynamically determined localized fluid velocity to adjust a process recipe on-the-fly as the semiconductor substrate is being processed.

Once the localized fluid velocity (v) is determined, the controller 340 may utilize the localized fluid velocity (v) in a wide variety of ways. In some embodiments, the controller 340 may utilize the localized fluid velocity (v) determined at one or more radial positions (P) to control operating parameter(s) of a current or subsequently performed spin-on process. For example, the controller 340 may determine that the rotational speed of the spin chuck 310 and/or the flow rate of the processing liquid (L) dispensed by the first nozzle 322 should be adjusted to increase or decrease a fluid velocity of the processing liquid (L) across the substrate. In addition or alternatively, the controller 340 may determine that the scan position and/or the scan rate of the first nozzle 322 should be adjusted to avoid deleterious local fluid dynamic effects in one or more areas of the substrate.

In other embodiments, the controller 340 may utilize the localized fluid velocity (v) to determine additional information about the processing liquid and/or the process. For example, the controller 340 may use the localized fluid velocity (v) determined at one or more locations, as well as simulation, to infer the liquid condition at other locations on the substrate (or earlier/later in the dispense process). In another example, the controller 340 may simulate/model a steady state dispense to determine the height of the processing liquid at a particular radial position (P) given the localized fluid velocity (v) at that radial position. In a further example, the controller 340 may combine information obtained during the process described above with other sensor data in a virtual metrology control scheme. For example, the controller 340 could combine the images obtained by the optical sensor 330 with information obtained by other sensors (for example, dispense rate monitors, motor encoders, dispense nozzle "state" monitors) to determine the relationship of the sensor outputs to process performance (such as, for example, critical dimensions, CD).

Systems and methods for determining a localized fluid velocity of a processing liquid dispensed onto a spinning substrate are described in various embodiments. The systems and methods disclosed herein determine the localized fluid velocity of the processing fluid by inducing a perturbation within the processing liquid, and tracking movement of the perturbation over time as the perturbation flows along with the processing liquid at the unknown fluid velocity. A sensor (e.g., optical sensor 330) and controller (e.g., controller 340) are provided in each of the embodiments disclosed herein for tracking the movement of the perturbation and utilizing the tracked movement of the perturbation to determine a localized fluid velocity of the processing liquid at one or more radial positions on the semiconductor substrate. Once determined, the localized fluid velocity may be used to control operating parameter(s) of a current or subsequently performed spin-on process, and/or to determine additional information about the processing liquid and/or the process, as discussed further above.

It is noted that the controller described herein can be implemented in a wide variety of manners. In one example, the controller 340 shown in FIGS. 3-4 may be a computer. In another example, controller 340 may include at least one programmable integrated circuit 350 that is programmed with program instructions 360 to provide the functionality described herein. For example, the controller 340 may include one or more processors (such as a microprocessor, microcontroller, central processing unit, etc.), programmable logic devices (such as a complex programmable logic device (CPLD), field programmable gate array (FPGA), etc.), and/or other programmable integrated circuits can be programmed with software or other programming instructions to implement the functionality described herein for controller 340. It is further noted that the software or other programming instructions can be stored in one or more non-transitory computer-readable mediums (such as, e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits may cause the programmable integrated circuits to perform the processes, functions, and/or capabilities described herein. Other variations could also be implemented.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The substrate may also include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the systems and methods described herein will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for controlling one or more operational parameters of a spin-on process used to dispense a processing liquid onto a surface of a semiconductor substrate, the method comprising:

dispensing the processing liquid onto the surface of the semiconductor substrate while the semiconductor substrate is rotated at a predetermined rotational speed, wherein the processing liquid is dispensed at a predetermined flow rate, and wherein the processing liquid flows in a radial direction across the surface of the semiconductor substrate toward a periphery of the semiconductor substrate at an unknown fluid velocity;

inducing a localized thermal change within the processing liquid, wherein the localized thermal change flows along with the processing liquid at the unknown fluid velocity;

tracking movement of the localized thermal change over time as the localized thermal change flows along with the processing liquid at the unknown fluid velocity;

utilizing the tracked movement of the localized thermal change to determine a localized fluid velocity of the processing liquid at one or more radial positions on the semiconductor substrate; and controlling the one or more operational parameters of the spin-on process based on the localized fluid velocity of the processing liquid determined at the one or more radial positions.

2. The method of claim 1, wherein said controlling the one or more operational parameters of the spin-on process based on the localized fluid velocity of the processing liquid comprises controlling one or more of the following:

the predetermined rotational speed at which the semiconductor substrate is rotated;

the predetermined flow rate at which the processing liquid is dispensed;

a position of a nozzle dispensing the processing liquid; and a scan rate of the nozzle.

3. The method of claim 1, wherein the localized thermal change is created within the processing liquid before said dispensing the processing liquid onto the surface of the semiconductor substrate.

4. The method of claim 1, wherein the localized thermal change is created within the processing liquid after said dispensing the processing liquid onto the surface of the semiconductor substrate.

5. The method of claim 1, wherein said tracking the movement of the localized thermal change over time comprises:

obtaining a plurality of images of the surface of the semiconductor substrate over time as the localized thermal change flows along with the processing liquid at the unknown fluid velocity.

6. The method of claim 5, wherein said utilizing the tracked movement of the localized thermal change to determine the localized fluid velocity of the processing liquid at the one or more radial positions comprises:

analyzing the plurality of images to determine a first radial position of the localized thermal change at a first time and a second radial position of the localized thermal change at a second time, which is greater than the first time; and determining the localized fluid velocity of the processing liquid between the first radial position and the second radial position by dividing a difference between the second radial position and the first radial position by a difference between the second time and the first time.

7. The method of claim 1, wherein the localized fluid velocity is determined during an initial testing phase and used to control the one or more operational parameters of the spin-on process performed on the semiconductor substrate.

8. The method of claim 1, wherein the localized fluid velocity is determined dynamically during the spin-on process and used to adjust the one or more operational parameters in real-time as the semiconductor substrate is being processed.

9. A method for controlling one or more operational parameters of a spin-on process used to dispense a processing liquid onto a surface of a semiconductor substrate, the method comprising:

dispensing the processing liquid onto the surface of the semiconductor substrate while the semiconductor substrate is rotated at a predetermined rotational speed, wherein the processing liquid is dispensed at a predetermined flow rate, and wherein the processing liquid flows in a radial direction across the surface of the semiconductor substrate toward a periphery of the semiconductor substrate at an unknown fluid velocity;

creating a first surface wave within the processing liquid while the semiconductor substrate is rotated at the predetermined rotational speed, wherein the first surface wave flows along with the processing liquid at the unknown fluid velocity;

tracking movement of the first surface wave over time as the first surface wave progresses across the surface of the semiconductor substrate while the semiconductor substrate is rotated at the predetermined rotational speed;

utilizing the tracked movement of the first surface wave to determine radial positions of the first surface wave as the first surface wave flows along with the processing liquid at the unknown fluid velocity;

comparing the radial positions of the first surface wave to baseline radial positions of a second surface wave, which was previously created within the processing liquid when the semiconductor substrate was stationary, to detect changes in the radial positions of the first and second surface waves at various radial positions;

determining the localized fluid velocity of the processing liquid at one or more radial positions based on the detected changes in the radial positions of the first and second surface waves at the various radial positions; and controlling the one or more operational parameters of the spin-on process based on the localized fluid velocity of the processing liquid determined at the one or more radial positions.

10. The method of claim 9, wherein said creating the first surface wave within the processing liquid comprises:

utilizing sound energy to create the first surface wave within the processing liquid as the processing liquid is dispensed onto the surface of the semiconductor substrate while the semiconductor substrate is rotated at the predetermined rotational speed.

11. The method of claim 9, wherein said tracking the movement of the first surface wave over time comprises:

obtaining a plurality of images of the surface of the semiconductor substrate over time as the first surface wave flows along with the processing liquid at the unknown fluid velocity.

12. The method of claim 11, wherein said utilizing the tracked movement of the first surface wave to determine the radial positions of the first surface wave comprises:

analyzing the plurality of images to determine the radial positions of the first surface wave as the first surface wave flows along with the processing liquid at the unknown fluid velocity.

13. The method of claim 9, further comprising creating the second surface wave within a puddle of processing liquid provided on the surface of the semiconductor substrate while the semiconductor substrate is stationary.

14. The method of claim 13, wherein said creating the second surface wave within the puddle of processing liquid comprises:

utilizing sound energy to create the second surface wave within the processing liquid while the semiconductor substrate is stationary.

15. The method of claim 13, further comprising:

tracking movement of the second surface wave over time as the second surface wave progresses across the surface of the semiconductor substrate while the semiconductor substrate is stationary; and utilizing the tracked movement of the second surface wave to determine the baseline radial positions of the second surface wave.

16. The method of claim 15, wherein said tracking the movement of the second surface wave over time comprises:

obtaining a plurality of images of the surface of the semiconductor substrate over time as the second surface wave travels from a first baseline radial position across the surface of the semiconductor substrate to a final baseline radial position near a periphery of the semiconductor substrate.

17. The method of claim 16, wherein said utilizing the tracked movement of the second surface wave to determine the baseline radial positions of the second surface wave comprises analyzing the plurality of images to determine to determine the baseline radial positions of the second surface wave.

18. The method of claim 9, wherein said controlling the one or more operational parameters of the spin-on process based on the localized fluid velocity of the processing liquid comprises controlling one or more of the following:

the predetermined rotational speed at which the semiconductor substrate is rotated;

the predetermined flow rate at which the processing liquid is dispensed;

a position of a nozzle dispensing the processing liquid; and a scan rate of the nozzle.

19. The method of claim 9, wherein the localized fluid velocity is determined during an initial testing phase and used to control the one or more operational parameters of the spin-on process performed on the semiconductor substrate.

20. The method of claim 9, wherein the localized fluid velocity is determined dynamically during the spin-on process and used to adjust the one or more operational parameters in real-time as the semiconductor substrate is being processed.

* * * * *